United States Patent
Amaya et al.

(10) Patent No.: US 8,269,380 B2
(45) Date of Patent: Sep. 18, 2012

(54) BRUSHLESS MOTOR FOR WASHING MACHINE HAVING STRESS REDUCTION ON SENSOR CASING AND WASHING MACHINE HAVING THE BRUSHLESS MOTOR MOUNTED THEREIN

(75) Inventors: Takanori Amaya, Fukui (JP); Masahiko Morisaki, Fukui (JP)

(73) Assignee: Panasonic Corporation, Osaka (JP)

( * ) Notice: Subject to any disclaimer, the term of this patent is extended or adjusted under 35 U.S.C. 154(b) by 709 days.

(21) Appl. No.: 12/302,650

(22) PCT Filed: May 30, 2007

(86) PCT No.: PCT/JP2007/060950
§ 371 (c)(1),
(2), (4) Date: Jul. 7, 2009

(87) PCT Pub. No.: WO2007/139129
PCT Pub. Date: Dec. 6, 2007

(65) Prior Publication Data
US 2010/0019629 A1 Jan. 28, 2010

(30) Foreign Application Priority Data

Jun. 1, 2006 (JP) .................................. 2006-153402
Jan. 19, 2007 (JP) .................................. 2007-009747
Jan. 19, 2007 (JP) .................................. 2007-009748

(51) Int. Cl.
*H02K 5/16* (2006.01)
*H02K 5/22* (2006.01)
*H02K 5/04* (2006.01)
*H02K 5/10* (2006.01)
*H02K 11/00* (2006.01)
*H02K 29/00* (2006.01)

(52) U.S. Cl. ....... 310/43; 310/88; 310/68 R; 310/DIG. 6
(58) Field of Classification Search ............... 310/68 R, 310/43, 88; H02K 5/16, 5/22, 5/04, 5/10, H02K 11/00, 29/00
See application file for complete search history.

(56) References Cited

U.S. PATENT DOCUMENTS

| 2,899,817 | A | * | 8/1959 | Smith | ............................ 68/133 |
| 4,952,830 | A | * | 8/1990 | Shirakawa | ................... 310/68 B |
| 7,893,578 | B2 | * | 2/2011 | Hayashi et al. | ............. 310/68 B |
| 2003/0090166 | A1 | * | 5/2003 | Kobayashi et al. | ........... 310/144 |
| 2004/0084756 | A1 | * | 5/2004 | Kawakami et al. | ........... 257/666 |
| 2004/0119367 | A1 | * | 6/2004 | Hiwaki et al. | ................. 310/216 |

(Continued)

FOREIGN PATENT DOCUMENTS

JP 55-30881 A 3/1980

(Continued)

OTHER PUBLICATIONS

Machine translation of JP11356006, Ono et al., Dec. 1999.*

(Continued)

*Primary Examiner* — Quyen Leung
*Assistant Examiner* — Terrance Kenerly
(74) *Attorney, Agent, or Firm* — RatnerPrestia (57) ABSTRACT

A brushless motor, to be used in a washing machine, includes a stator, a rotor, a magnetic sensor, and a drive circuit. The magnetic sensor and the drive circuit are accommodated in a case, and sealed with moisture-proof sealing resin, thereby forming a drive circuit unit, which is built in the brushless motor.

15 Claims, 9 Drawing Sheets

U.S. PATENT DOCUMENTS

2005/0011233 A1* 1/2005 Vaidhyanathan et al. ..... 68/23.7
2006/0283625 A1* 12/2006 Yamamichi et al. .......... 174/255

FOREIGN PATENT DOCUMENTS

| | | | |
|---|---|---|---|
| JP | 04-256791 A | | 9/1992 |
| JP | 05176493 | * | 7/1993 |
| JP | 11-103178 A | | 4/1999 |
| JP | 11-103178 A | | 4/1999 |
| JP | 11-155249 A | | 6/1999 |
| JP | 11356006 | * | 12/1999 |
| JP | 2001-061258 A | | 6/2001 |
| JP | 2002-330571 A | | 11/2002 |
| JP | 2002-330571 A | | 11/2002 |
| JP | 2004-112866 A | | 4/2004 |
| JP | 2004-112866 A | | 4/2004 |
| JP | 2006-074858 A | | 3/2006 |
| JP | 2006-074858 A | | 6/2006 |
| JP | 2008-517952 | | 6/2011 |

OTHER PUBLICATIONS

Machine translation of JP05176493, Higuchi et al., Jul. 1993.*
International Search Report for PCT/JP2007/060950 dated Aug. 28, 2007.

* cited by examiner

BRUSHLESS MOTOR FOR WASHING MACHINE HAVING STRESS REDUCTION ON SENSOR CASING AND WASHING MACHINE HAVING THE BRUSHLESS MOTOR MOUNTED THEREIN

THIS APPLICATION IS A U.S. NATIONAL PHASE APPLICATION OF PCT INTERNATIONAL APPLICATION PCT/JP2007/060950.

TECHNICAL FIELD

The present invention relates to a brushless motor to be used in a washing machine, and it also relates to the washing machines using the same brushless motor.

BACKGROUND ART

Washing machines have mainly employed induction motors (e.g. refer to Patent Documents 1 and 2); however, in recent years, brushless motors have been increasingly used in washing machines in order to obtain higher efficiency for an energy saving purpose. When the brushless motor is mounted in washing machines, it is critical for the motor to take measures against moisture, because its drive circuit must be protected from dew formation and moisture.

Drip-proof and moisture-proof structures of the drive circuit can be achieved by molding a motor stator and the drive circuit into one unit with resin (e.g. refer to Patent Document 3). However, if there is a component or a soldered section vulnerable to the molding resin injected at a high temperature and a high pressure, the component or the soldered section must be sealed with resin that is hardened at a low temperature and a low pressure (e.g. refer to Patent Document 4). In this case, it is sometimes needed to ease the stress produced during the hardening of the sealing resin.

Patent Document 1: Unexamined Japanese Patent Application Publication No. 2004-112866
Patent Document 2: Unexamined Japanese Patent Application Publication No. H04-256791
Patent Document 3: Unexamined Japanese Patent Application Publication No. H11-155249
Patent Document 4: Unexamined Japanese Patent Application Publication No. 2001-61258

DISCLOSURE OF INVENTION

A brushless motor, to be used in a washing machine, of the present invention has the following elements:
  a stator including stator windings;
  a rotor including magnets;
  a magnetic sensor for sensing a position of the rotor; and
  a drive circuit including a circuit board and exciting the stator windings in response to information supplied from the magnetic sensor.
The magnetic sensor and the drive circuit are accommodated in a housing and sealed with moisture-proof sealing resin, thereby forming a drive circuit unit, which is built in the brushless motor. The foregoing structure allows providing the drive circuit unit with a moisture-proof structure. Since the sealing resin is injected at a low pressure, the drive circuit cannot be damaged by the injected sealing resin.

DESCRIPTION OF REFERENCE MARKS 100 stator
102 cover of motor
103 rotor
104 bracket
105 drive circuit
106 mounting hole
107 case
108 drive circuit unit
109 flange
112 circuit board
113 sealing resin
114 electronic component
120 hole
121 thinner section
122 recessed section
123 through hole
310 housing
311 washing tub
312 agitator
313 shaft
314 gear
315 driven pulley
316 belt
317 driving pulley
318 brushless motor
410 housing
411 washing tub
412 drum
413 shaft
414 bearing
415 driven pulley
416 belt
417 driving pulley
418 brushless motor
419 projected section
420 mounting hole

DESCRIPTION OF PREFERRED EMBODIMENT

Figure 1:
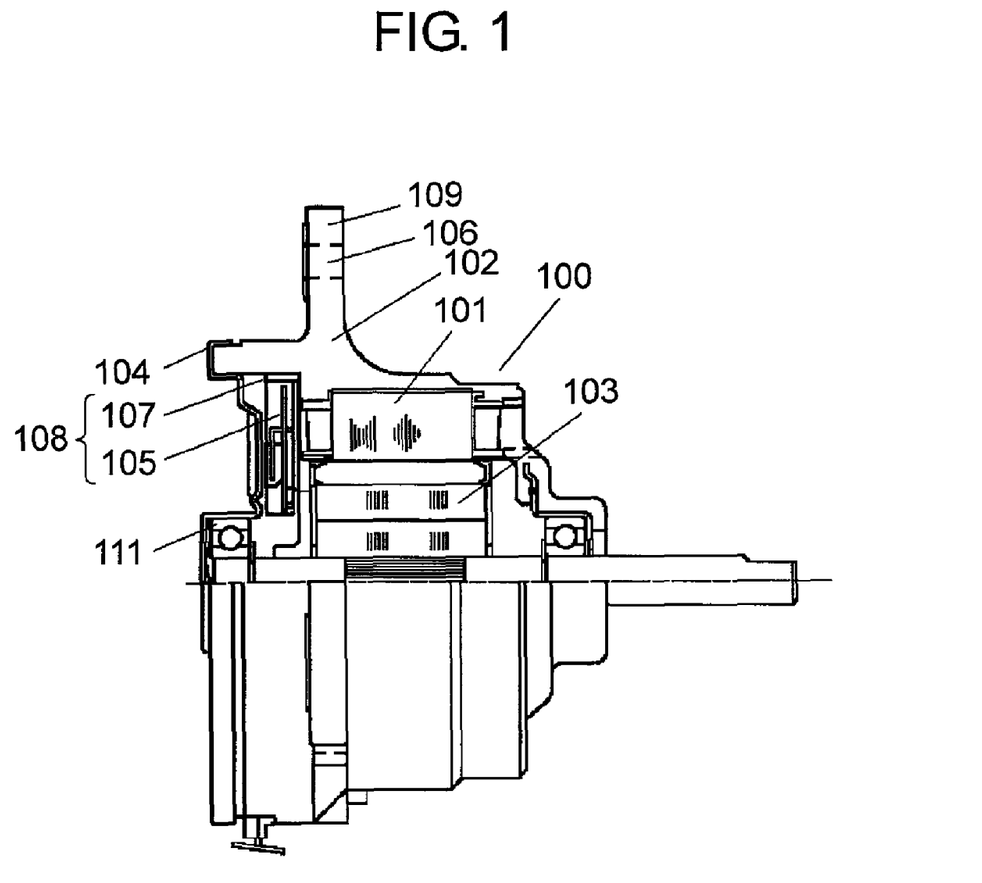
FIG. 1 shows a sectional view in part of a brushless motor in accordance with an exemplary embodiment of the present invention.

An exemplary embodiment of the present invention is demonstrated hereinafter with reference to the accompanying drawings. FIG. 1 shows a sectional view in part of a brushless motor, to be used in a washing machine, in accordance with this embodiment of the present invention. In FIG. 1, stator core 101 including 3-phase stator windings is covered with cover 102 formed with a molding resin, thereby forming stator 100. Cover 102 includes mounting hole 106 at flange 109. Rotor 103 including magnets is inserted into stator core 101. A magnetic sensor (not shown) for sensing a rotor position and drive circuit 105 for exciting the stator windings in response to the information supplied from the magnetic sensor are accommodated in case 107 made of resin. The magnetic sensor and drive circuit 105 are then sealed with moisture-proof resin in case 107, thereby forming drive circuit unit 108, which includes connecting wires (not shown) to stator coils. Drive circuit unit 108 is rigidly mounted in the brushless motor after rotor 103 is inserted into stator core 101. Bracket 104 supports rotor 103 via bearing 111. A power element placed in drive circuit 105 is connected to bracket 104 via thermal conductive resin for dissipating its heat. The brushless motor is thus completed.

Figure 2:
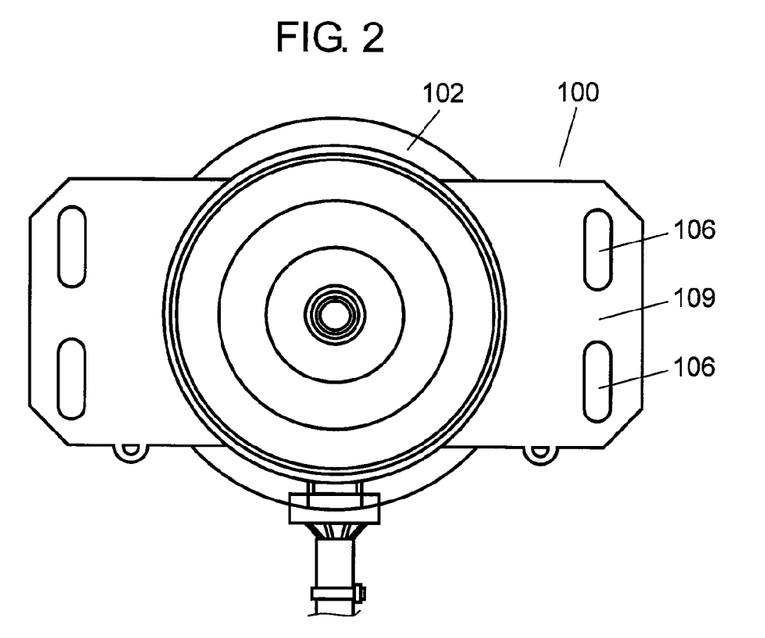
FIG. 2 shows a front view of the brushless motor.
Figure 3:
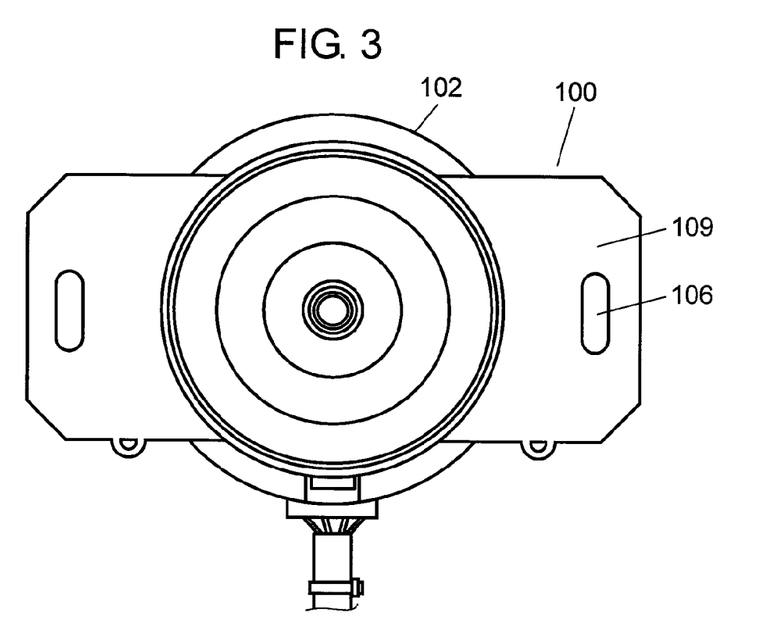
FIG. 3 shows a front view of another brushless motor.

FIG. 2 and FIG. 3 show front views of the motors. Stator 100 includes mounting hole 106 at flange 109 formed with a molding resin and formed unitarily with cover 102. FIG. 2 and FIG. 3 show the different numbers of mounting holes. A user can select one of them depending on an output of the motors. Drive circuit 105 can be insert-molded and buried in cover 102 formed with a molding resin. In this case, pay attention to a pressure of the insert molding so as not to affect drive circuit 105.

Figure 4:
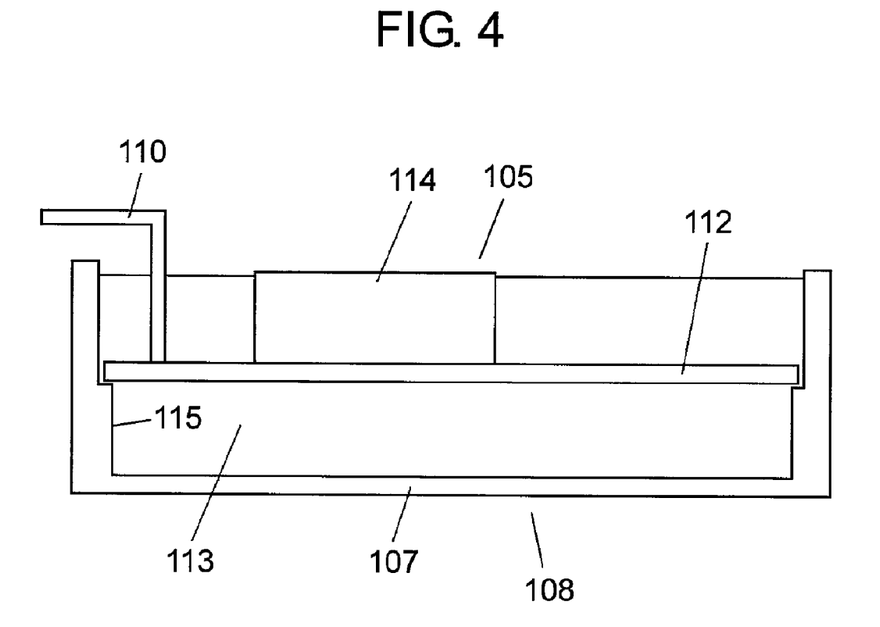
FIG. 4 shows a sectional view in part of a drive circuit unit.
Figure 5:
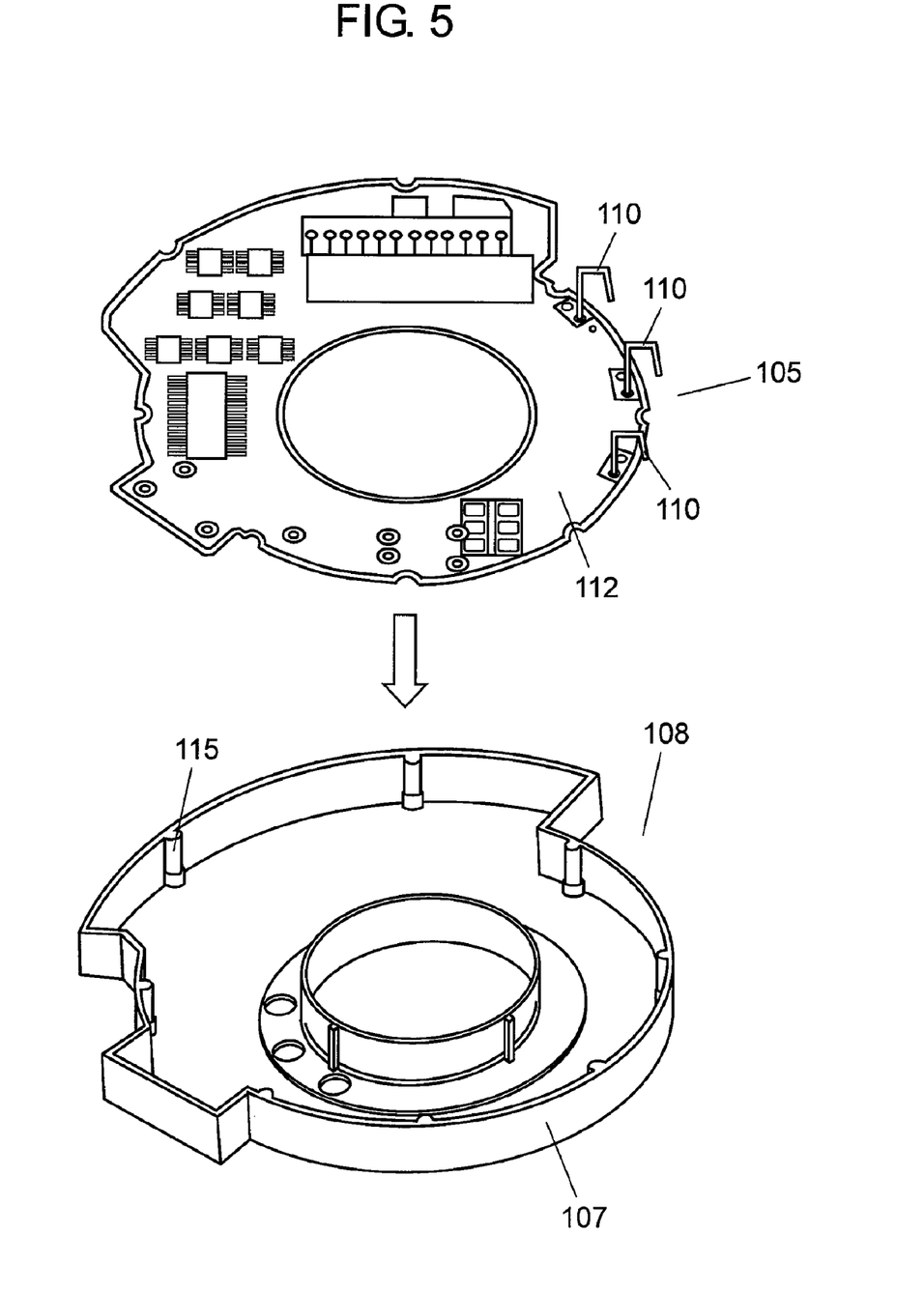
FIG. 5 shows an appearance of the drive circuit unit.

A structure of drive circuit unit 108 is described hereinafter. FIG. 4 shows a sectional view of drive circuit unit 108, and FIG. 5 shows an appearance of drive circuit unit 108. Drive circuit 105 includes circuit board 112, which is positioned with projections 115 and placed in case 107. There is some clearance between circuit board 112 and case 107. Connecting wires 110 connect circuit board 112 to the stator windings. Sealing resin 113 (hereinafter simply referred to as resin 113) is poured into case 107 for sealing drive circuit 105. If heat is desirably dissipated from electronic component 114, the top face of component 114 is exposed from the surface of resin 113, and the top face is stuck to a radiator (not shown) via thermal conductive resin. Bracket 104 can be used as the radiator.

Figure 6:
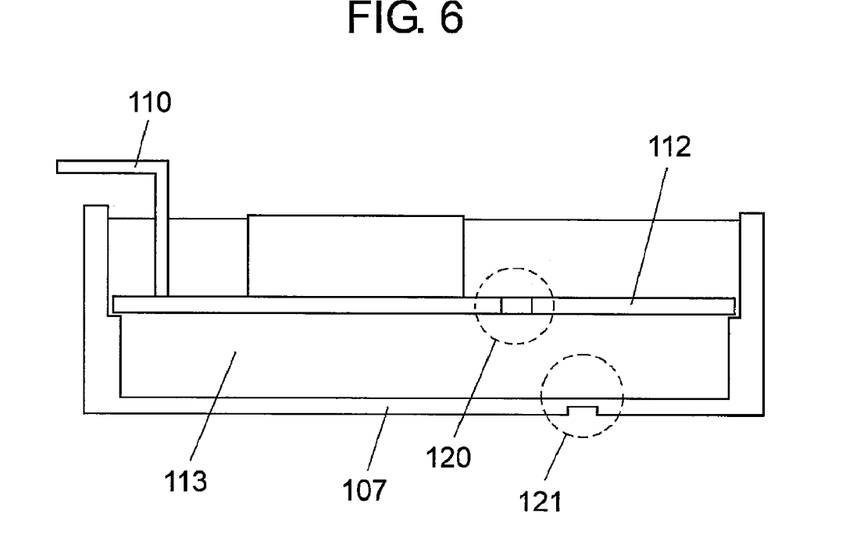
FIG. 6 shows a sectional view in part of another drive circuit unit.

When resin 113 poured into case 107, an air void tends to occur at certain places such as a place opposite to an inlet of resin 113, a dead end of the resin flow, a juncture of resin flows, or a place behind a large-size component. Voids not filled with resin 113 thus sometimes remain, so that the foregoing places are provided with an air discharging path in order to reduce the voids. The air discharging path can be formed by, e.g. widening the clearance between case 107 and circuit board 112, or providing circuit board 112 with hole 120 as shown in FIG. 6. These air discharging paths also easing the stress produced during the hardening of resin 113. The foregoing structure allows sealing circuit board 112 with resin 113. Since resin 113 is a potting resin injected at a low pressure, it does not damage circuit board 112.

Figure 7:
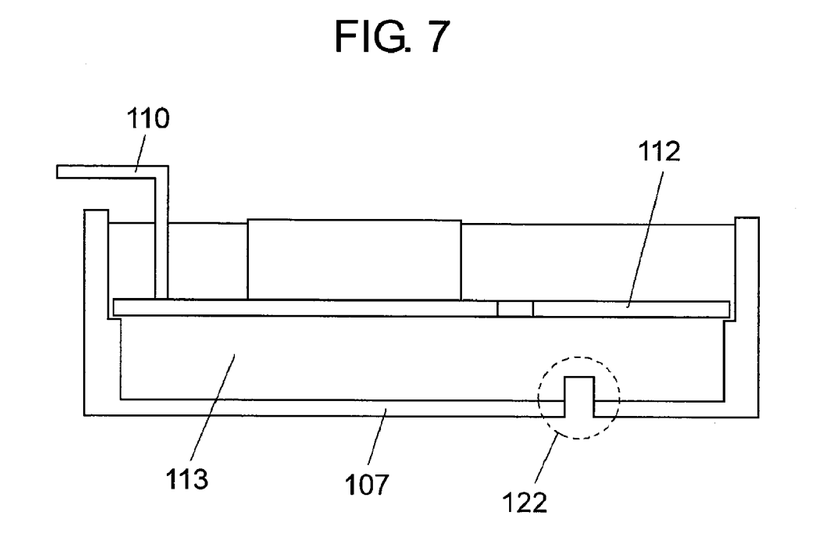
FIG. 7 shows a sectional view in part of yet another drive circuit unit.
Figure 8:
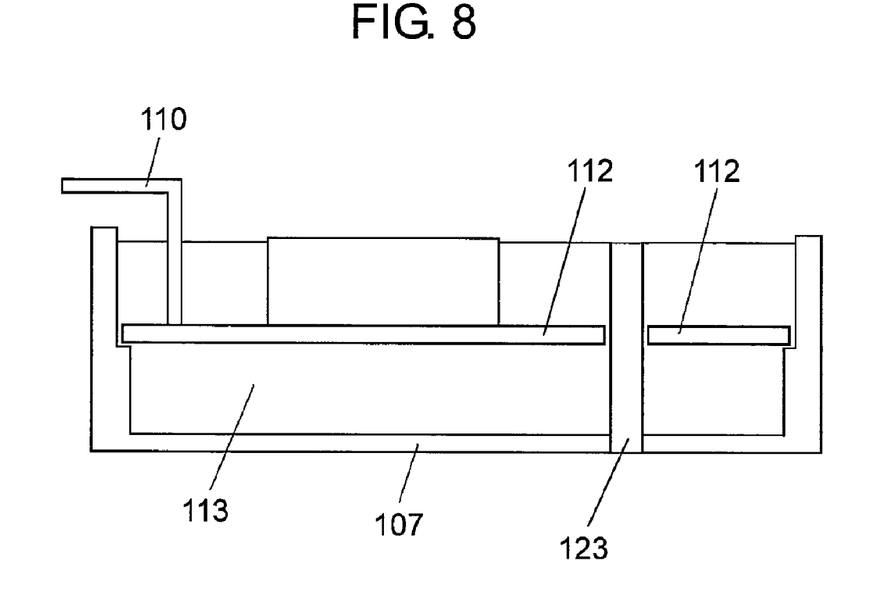
FIG. 8 shows a sectional view in part of still another drive circuit unit.
Figure 9:
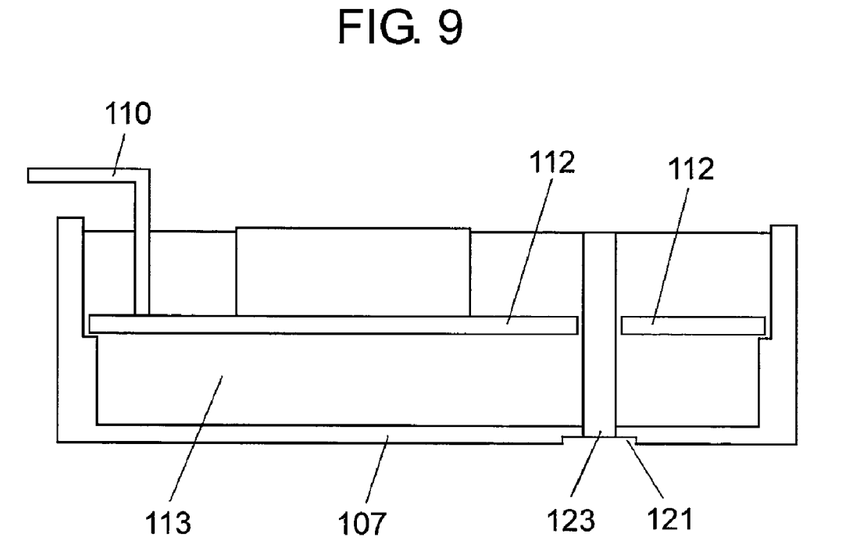
FIG. 9 shows a sectional view in part of another drive circuit unit.

Another case 107 shown in FIG. 6 includes thinner section 121, which can ease the stress produced during the hardening of resin 113. Yet another case 107 shown in FIG. 7 includes recessed sections 122, which are formed after resin 113 is hardened. Recessed sections 122 can ease the residual stress remaining after resin 113 is hardened. Still another case 107 shown in FIG. 8 includes through-hole 123 which is formed after resin 113 is hardened. Through-hole 123 extends through case 107, resin 113 and circuit board 112 so that it can ease the residual stress remaining after resin 113 is hardened. Another case 107 shown in FIG. 9 includes both of thinner section 121 and through-hole 123. Through-hole 123 extends through thinner section 121, resin 113 and circuit board 112 so that it can further ease the residual stress remaining after resin 113 is hardened.

Figure 10:
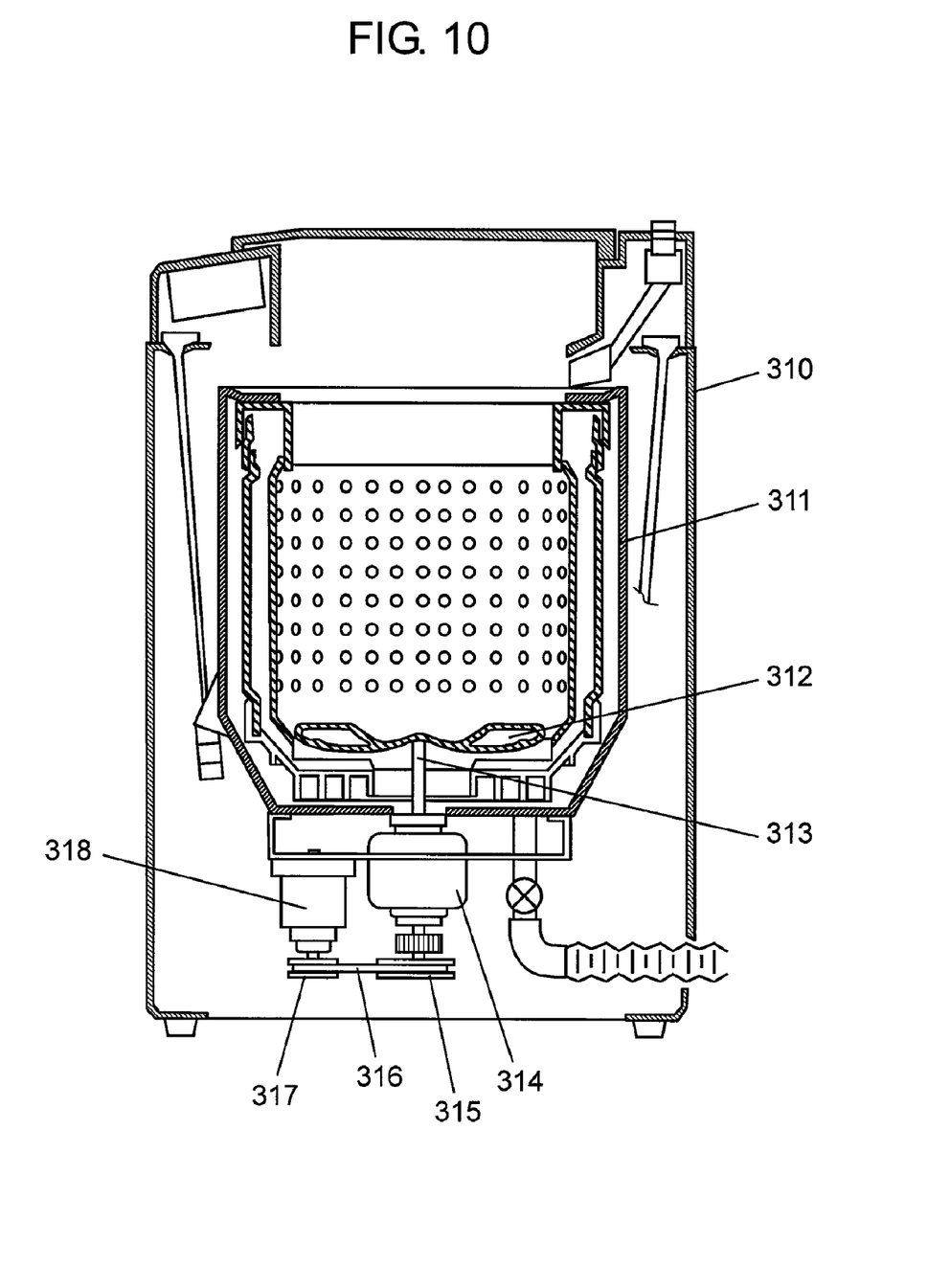
FIG. 10 shows a sectional view of a washing machine in which the brushless motor in accordance with the embodiment of the present invention is mounted.

FIG. 10 shows a first example of a structure of a washing machine which employs the brushless motor in accordance with this embodiment of the present invention. The washing machine has the following elements:
housing 310;
washing tub 311 placed in housing 310;
agitator 312 placed in washing tub 311;
shaft 313 coupled to agitator 312 at a first end of shaft 313;
gear (transmission mechanism) 314 coupled to a second end of shaft 313;
driven pulley 315 coupled to shaft 313 via gear 314;
belt 316 entrained on driven pulley 315 at a first end of belt 316;
driving pulley 317 on which second end of belt 316 is entrained; and
brushless motor 318 coupled to driving pulley 317.
The brushless motor shown in FIG. 1 or FIG. 2 can be used as brushless motor 318.

Figure 11:
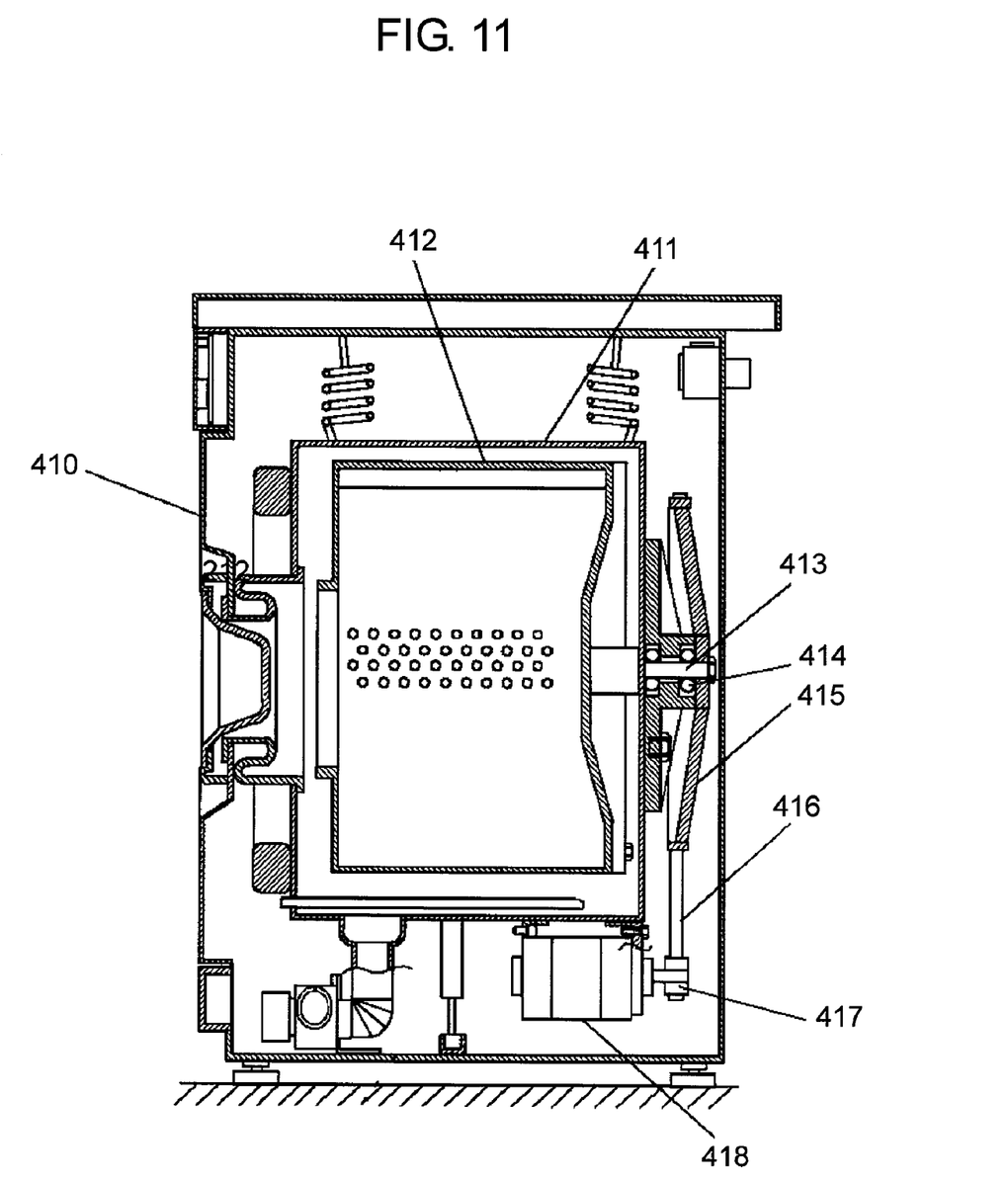
FIG. 11 shows a sectional view of another washing machine in which the brushless motor in accordance with the embodiment of the present invention is mounted.
Figure 12:
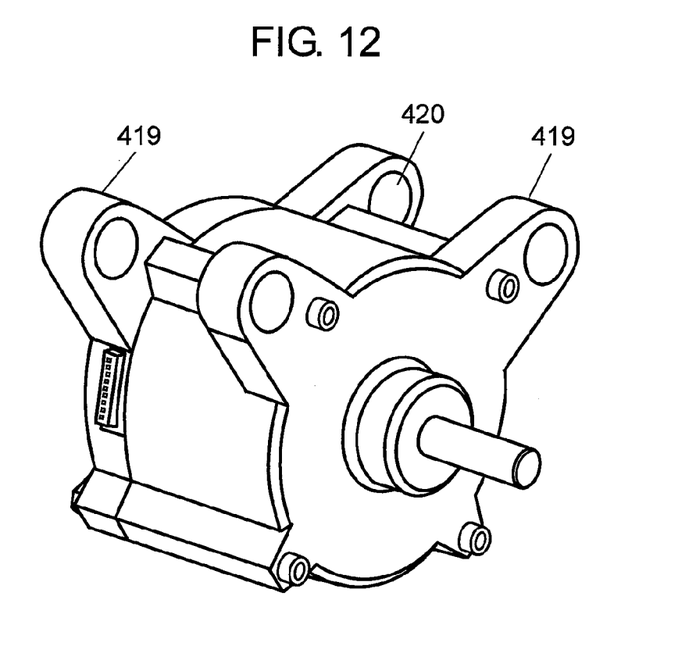
FIG. 12 shows an appearance of the brushless motor.
Figure 13:
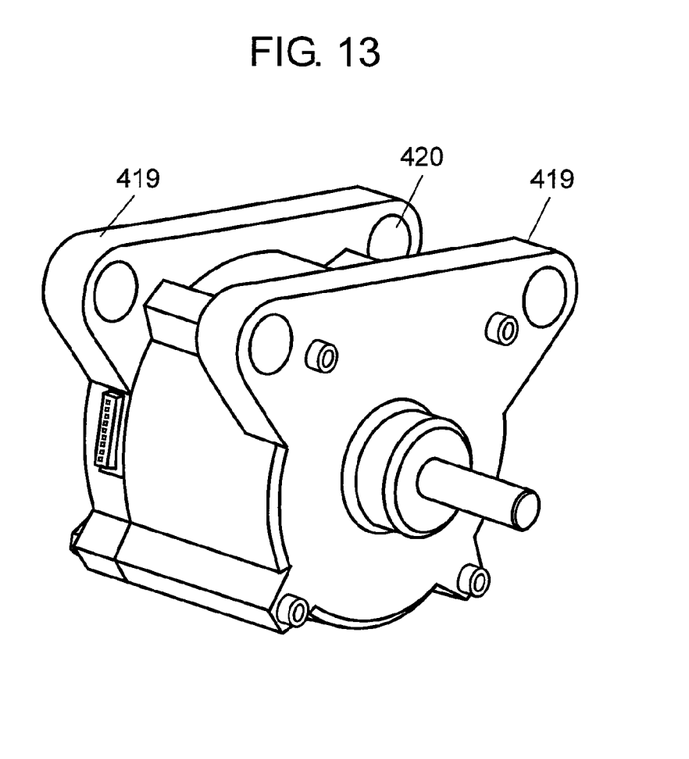
FIG. 13 shows an appearance of another brushless motor.

FIG. 11 shows a second example of another structure of a washing machine which employs the brushless motor in accordance with this embodiment of the present invention. The washing machine has the following elements:
housing 410;
washing tub 411 placed in housing 410;
drum 412 placed in washing tub 411;
shaft 413 coupled to drum 412 at a first end of shaft 413;
bearing 414 coupled to a second end of shaft 413;
driven pulley 415 coupled to shaft 413;
belt 416 entrained on driven pulley 415 at a first end of belt 416;
driving pulley 417 on which a second end of belt 416 is entrained; and
brushless motor 418 coupled to driving pulley 417.
The brushless motor of which appearance is shown in FIG. 12 or FIG. 13 can be used as brushless motor 418. The cover of motor 418 is formed with a molding resin, and includes multiple projected sections 419, which extend along a radial direction of the motor as well as mounting holes 420 at ends of projected sections 419. Brushless motor 418 has a similar structure to brushless motor 318 except its appearance.

Industrial Applicability

A brushless motor of the present invention is equipped with a moisture proof structure, so that it is useful for washing machines.

The invention claimed is:

1. A brushless motor, to be used in a washing machine, comprising:
    a stator including a stator winding;
    a rotor including a magnet;
    a magnetic sensor for sensing a position of the rotor;
    a drive circuit including a circuit board and exciting the stator winding in response to information supplied from the magnetic sensor; and
    a case accommodating the magnetic sensor and the drive circuit therein, the case sealed with moisture-proof sealing resin to form a drive circuit unit, the case comprising a discontinuity in its outer surface, the discontinuity configured to lessen a stress on the case during hardening of the moisture-proof sealing resin, the discontinuity including at least any one of a thinner section, a plurality of recessed sections, and a through-hole.

2. The brushless motor of claim 1, wherein a cover of the motor is formed with a molding resin, and the drive circuit is disposed in the cover.

3. The brushless motor of claim 1, wherein a cover of the motor is formed with a molding resin, and the drive circuit is buried in the cover.

4. The brushless motor of claim 1, wherein the drive circuit unit includes an air discharging path in the sealing resin for preventing a void from being produced.

5. The brushless motor of claim 1, wherein the drive circuit unit includes an air discharging path in the sealing resin at a place where a void is frequently produced for preventing the void from being produced.

6. The brushless motor of claim 1, wherein the circuit board of the drive circuit includes a hole as an air discharging path.

7. The brushless motor of claim 1, wherein the circuit board of the drive circuit includes a hole for easing stress produced by the sealing resin.

8. The brushless motor of claim 1, wherein the through-hole extends through the case, the circuit board, and the sealing resin for easing the stress produced by the sealing resin.

9. The brushless motor of claim 1, wherein the discontinuity comprises the thinner section and the through-hole, and the through-hole extends through the thinner section, the circuit board, and the sealing resin for easing the stress produced by the sealing resin.

10. The brushless motor of claim 1 further comprising a cover formed with a molding resin, which cover includes two projected sections extending along a radial direction of the motor, and a mounting hole at an end of the projected sections.

11. The brushless motor of claim 10, wherein each one of the projected sections includes one of one mounting hole and two mounting holes.

12. The brushless motor of claim 1 further comprising a cover formed with a molding resin, which cover includes a plurality of projected sections extending along a radial direction of the motor, and a mounting hole at an end of the projected sections.

13. The brushless motor of claim 1, wherein the brushless motor is used in a washing machine comprising:
a housing;
a washing tub disposed in the housing;
an agitator disposed in the washing tub;
a shaft coupled to the agitator at a first end of the shaft;
a gear coupled to a second end of the shaft;
a driven pulley coupled to the shaft via the gear;
a belt entrained on the driven pulley at a first end of the belt; and
a driving pulley on which a second end of the belt is entrained,
wherein the brushless motor is coupled to the driving pulley.

14. The brushless motor of claim 1, wherein the brushless motor is used in a washing machine comprising:
a housing;
a washing tub disposed in the housing;
a drum disposed in the washing tub;
a shaft coupled to the drum at a first end of the shaft;
a bearing coupled to a second end of the shaft;
a driven pulley coupled to the shaft;
a belt entrained on the driven pulley at a first end of the belt; and
a driving pulley on which a second end of the belt is entrained,
wherein the brushless motor is coupled to the driving pulley.

15. A washing machine employing the brushless motor as defined in claim 1.

* * * * *

UNITED STATES PATENT AND TRADEMARK OFFICE
CERTIFICATE OF CORRECTION

PATENT NO. : 8,269,380 B2
APPLICATION NO. : 12/302650
DATED : September 18, 2012
INVENTOR(S) : Takanori Amaya et al.

It is certified that error appears in the above-identified patent and that said Letters Patent is hereby corrected as shown below:

On the Title Page

Item [56], References Cited, FOREIGN PATENT DOCUMENTS, page 2, please delete the following duplicate references:

"JP 11-103178A 4/1999
JP 2002-330571A 11/2002
JP 2004-112866A 04/2004
JP 2006-074858A 6/2006"

Also under Item [56], References Cited, FOREIGN PATENT DOCUMENTS, page 2, "JP 2001-061258A 6/2001" should read -- JP 2001-061258A 3/2001 --.

Signed and Sealed this
Twelfth Day of February, 2013

Teresa Stanek Rea
*Acting Director of the United States Patent and Trademark Office*